(12) United States Patent
Zong

(10) Patent No.: US 12,173,175 B2
(45) Date of Patent: Dec. 24, 2024

(54) WATER-RESISTANT NANOFILM, PREPARATION METHOD AND ARTICLE THEREOF

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 336 days.

(21) Appl. No.: 17/596,949

(22) PCT Filed: Jun. 12, 2020

(86) PCT No.: PCT/CN2020/095837
§ 371 (c)(1),
(2) Date: Dec. 22, 2021

(87) PCT Pub. No.: WO2021/017663
PCT Pub. Date: Feb. 4, 2021

(65) Prior Publication Data
US 2022/0235240 A1    Jul. 28, 2022

(30) Foreign Application Priority Data

Jul. 26, 2019 (CN) .......................... 201910680686.6
Aug. 2, 2019 (CN) .......................... 201910712672.8

(51) Int. Cl.
*C09D 133/16* (2006.01)
*C09D 137/00* (2006.01)
*C09D 143/04* (2006.01)
*C23C 16/513* (2006.01)

(52) U.S. Cl.
CPC ......... *C09D 133/16* (2013.01); *C09D 137/00* (2013.01); *C09D 143/04* (2013.01); *C23C 16/513* (2013.01)

(58) Field of Classification Search
None
See application file for complete search history.

(56) References Cited

U.S. PATENT DOCUMENTS

| 5,302,420 A * | 4/1994 | Nguyen ................... B05D 1/62 427/255.6 |
| 6,083,313 A | 7/2000 | Venkatraman et al. |
| 2002/0001725 A1* | 1/2002 | Ichimura ................ G02B 1/111 427/574 |
| 2003/0113479 A1* | 6/2003 | Fukuda ............. H01J 37/32825 156/345.43 |
| 2005/0133059 A1 | 6/2005 | Chen et al. |
| 2009/0286133 A1 | 11/2009 | Trabold et al. |
| 2015/0240354 A1 | 8/2015 | Han et al. |

FOREIGN PATENT DOCUMENTS

| CN | 1145941 A | 3/1997 |
| CN | 101045610 | 10/2007 |
| CN | 101487904 A | 7/2009 |
| CN | 106916331 | 7/2017 |
| CN | 109354941 | 2/2019 |
| CN | 110129769 | 8/2019 |
| CN | 110665768 | 1/2020 |
| EP | 0 745 568 A1 | 5/1996 |
| EP | 0 985 741 | 3/2000 |
| EP | 3 341 137 | 7/2018 |
| JP | 2003/514983 | 4/2003 |
| JP | 2014/125670 | 7/2014 |
| KR | 2015/0118927 | 10/2015 |
| WO | WO 2011/104500 | 9/2011 |

OTHER PUBLICATIONS

Office Communication issued in correspondence Japanese Application No. 2022-503448 dated Jan. 10, 2023 { Original and English translation}.
Extended European Search Report issued in European Application No. 20847885.9, mailed Aug. 19, 2022.
English translation of International Search Report and Written Opinion issued in International Patent Application No. PCT/CN2020/095837, dated Sep. 11, 2020.
Office Action issued in Chinese Application No. 201910712672.8, dated Apr. 6, 2021.
Office Action issued in Chinese Application No. 201910712672.8, dated Apr. 6, 2021, and English language translation thereof.

* cited by examiner

*Primary Examiner* — Ramsey Zacharia
(74) *Attorney, Agent, or Firm* — Parker Highlander PLLC

(57) ABSTRACT

The present disclosure provides a water-resistant nanofilm, a preparation method and an article thereof, in which fluorocarbon gas is used as a plasma source and is formed on a substrate surface of substrate by a plasma enhanced chemical vapor deposition method, so that the water-resistance performance of the substrate surface is improved.

10 Claims, No Drawings

WATER-RESISTANT NANOFILM, PREPARATION METHOD AND ARTICLE THEREOF

CROSS-REFERENCE TO RELATED APPLICATIONS

This application is the national phase of International Application No. PCT/CN2020/095837, filed on Jun. 12, 2020, which claims the benefit of priority to Chinese Patent Application No. 201910680686.6, filed on Jul. 26, 2019, and Chinese Patent Application No. 201910712672.8, filed on Aug. 2, 2019, the entire disclosure of which are incorporated herein by reference.

TECHNICAL FIELD

The present disclosure relates to a surface modified film, and in particular to a water-resistant nanofilm formed by plasma enhanced chemical vapor deposition, preparation method, application and article thereof.

BACKGROUND

Film deposition on a substrate surface is a common technology to achieve substrate surface modification, for instance, to improve dielectric properties, water-resistance or hydrophobic properties by film deposition. Film deposition can be achieved by a number of technologies. Familiar technologies include chemical deposition, physical deposition, and a mixture of aforesaid two depositions. In terms of chemical deposition, the common technologies includes such as plating, chemical solution deposition (CSD), and chemical vapor deposition (CVD). In terms of physical deposition, the common technologies includes such as thermal evaporation, sputtering, pulsed laser deposition and cathode arc deposition.

The low polarization rate and strong electro-negativity of fluorine atoms in fluorocarbon materials give fluorocarbon polymers many unique properties, such as high hydrophobicity and oil resistance, corrosion resistance of chemical reagents, excellent weather resistance, etc., therefore, fluorocarbon materials are widely used in the construction coating, textile industry, military industry and other fields for surface modification.

The hydrophobicity of fluorocarbon materials is closely related to the length of the perfluorocarbon chain, and the crystallinity increases with the increase of the number of carbon atoms in the perfluorocarbon chain, which is conducive to improving its hydrophobic properties. Currently, what is widely applied to the fabric is the organics of which the number of perfluoroalkyl carbon atoms is up to 8. In contrast, when the number of the alkyl carbon atoms is below 6, the hydrophobicity decreases significantly, which is difficult to meet the needs of practical applications. However, the use of a large number of long carbon chain perfluoroalkyl tends to produce organic compounds similar to PFOA, PFOS and the like which is harmful to the environment and difficult to degrade. Since 2003, USEPA proposed that the exposure of PFOA and its main salt would lead to adverse effects on the development of human health and other aspects. In Europe, under the influence of the United States, PFOA was also banned according to the general safety standards of EU2004/1935/EC (a decision on materials and substances in contact with food). On Jun. 14, 2017, the European Union (EU) published in its official Journal (EU)2017/1000 a new restriction clause on perfluorooctanoic acid (PFOA) in Annex XVII of REACH, item 68, officially including PFOA and its salts and related substances in the list of REACH restrictions. As early as December 2002, the 34th joint meeting of Chemical Committee hold by OECD defined PFOS as substances that persist in the environment, have biosavings and are harmful to human beings. These regulations pose technical challenges in obtaining good protective nano-coatings.

Chinese patent publication CN102471405A discloses a fluoroalkyl group-containing n-substituted (meth)acrylamide compound, polymer thereof, and use thereof. N-substituted (meth)acrylamide compounds containing fluoroalkyl are used to form a protective layer on the surface of the treated samples to achieve the purpose of rust prevention and hydrophobicity, and not restricted by the use of PFOA and PFOA analogues. When the carbon number is less than 6, it can still maintain excellent hydrophobicity. The product obtained in the disclosure generally needs to be mixed into a solution of a certain concentration with organic solvent and preferably fluorine solvent before use, and then coated on the surface of the product. This liquid coating method has many disadvantages including producing waste water, waste gas and waste liquid. Liquid phase method uses solvent which can produce certain damage to electronic device substrate itself. Moreover, most of film formed have a thickness up to dozens of micrometers, which is difficult to control at a nanometer level and thus have certain influence on the heat and signal transmission function of the electronic device.

Plasma chemical vapor deposition (PCVD) is a kind of technology that activates the reaction gas by plasma to make it react chemically on the surface of the substrate or near the surface space to generate solid film, which belongs to one kind of chemical deposition process.

In the process of nanocoating by PCVD, the plasma is firstly formed by the plasma source gas, and then the raw material gas is gradually deposited on the surface of the substrate in the plasma atmosphere. Plasma gas raw material and reaction raw material are the two main raw materials, which affect the basic properties of the films formed by them. For instance, at the beginning of the reaction, some inert gases such as He and Ar are often added as plasma sources to improve the plasma concentration in the reaction chamber, and to maintain the necessary equilibrium concentration of plasma particles during the coating process. [Hubert, J.; Vandencasteele, N.; Mertens, J. et al. Chemical and Physical Effects of the Carrier Gas on the Atmospheric Pressure PECVD of Fluorinated Precursors. Plasma Processes and Polymers 2015, 12 (10), 1174-1185.] Chinese patent CN107058982 provides a method for preparation of liquid-resistant coating with multi-layer structure, in which inert gas or nitrogen is introduced in the treatment stage of chemical vapor deposition process and in the process of coating deposition. Inert gas is helium or argon. U.S. Pat. No. 6,663,713 discloses a method and apparatus for forming a polymer layer on a semiconductor substrate in combination with deposition (and etching) of any polymer or polymerizable dielectric substrate, including, for instance, xylene, tetrafluoroethylene, polytetrafluoroethylene, naphthalene or polynaphthalene. A continuous supply of reactionpolymerizable material can be supplied to the chamber through a gas inlet. Preferably, inert carrier gas such as helium or argon is used to supply the reaction polymerizable material to the chamber. The inert gas and radio frequency bias can be used to form plasma in the processing chamber. However, inventors found that as inert gas was used as plasma source, the hydrophobicity of the nanocoating obtained by plasma chemical vapor deposition was generally poor, and even the contact angle was lower than 100°, when the number of carbon atoms of the perfluorocarbon chain used as reaction material was lower than 6, especially lower than 4.

SUMMARY

According to embodiments of present disclosure, a water-resistant nanofilm, a preparation method, an application and an article thereof is provided, in which fluorocarbon gas is used as a plasma source. The plasma source itself has a high fluoride content, thereby increasing the fluorine content in the formed water-resistant nanofilm.

According to embodiments of present disclosure, water-resistant nanofilm and preparation method, application and article thereof is provided, wherein the fluorocarbon gas has a structural formula $C_xF_{2x+2}$ or $C_xF_{2x}$, and x is 1, 2, or 3, thereby obtaining a low carbon and high fluorine plasma source.

According to embodiments of the present disclosure, a water-resistant nanofilm and preparation method, application and article thereof is provided, which ameliorates the disadvantage of poor hydrophobicity of the nanocoating deposited when the carbon atom number of the perfluorocarbon chain is less than 6.

According to embodiments of the present disclosure, a water-resistant nanofilm and preparation method, application and article thereof is provided. The reaction raw materials are used, in which the carbon atom number of perfluorocarbon chain is 6 and below 6, to obtain the water-resistant nanofilm with a static water contact angle greater than 110°.

According to embodiments of the present disclosure, a water-resistant nanofilm and preparation method, application and article thereof is provided. The plasma source formed of the fluorocarbon plasma source has a stronger etching ability on the surface of the substrate, which is conducive to the formation of rough structure on the surface of the substrate. It can not only improve the hydrophobicity, but also improve the adhesion between the nanofilm and the substrate.

According to embodiments of the present disclosure, a water-resistant nanofilm and preparation method, application and article thereof is provided. It reduces environmental pollution from the perspective of raw materials, and makes the nanofilm layer formed of environmental protection raw material through vapor deposition process have better hydrophobicity.

According to embodiments of the present disclosure, a water-resistant nanofilm and preparation method, application and article thereof is provided. The water-resistant nanofilm can be deposited on the surface of electronic products, silk goods, woven bags, metal products, glass products, ceramic products and other substrates, so that the surface of the substrate has water-resistance or liquid-resistance.

In order to achieve at least one of objectives of the present disclosure, one aspect of the present disclosure provides a water-resistant nanofilm, and the water-resistant nanofilm formed on a surface of a substrate by plasma enhanced chemical vapor deposition through using fluorocarbon gas as plasma source.

According to the water-resistant nanofilm described in one embodiment, the fluorocarbon gas has a structural formula $C_xF_{2x+2}$, and x is 1, 2, or 3.

According to the water-resistant nanofilm described in one embodiment, the fluorocarbon gas has a structural formula $C_xF_{2x}$, and x is 1, 2, or 3.

According to the water-resistant nanofilm described in one embodiment, the fluorocarbon gas includes carbon tetrafluoride.

According to the water-resistant nanofilm described in one embodiment, the fluorocarbon gas includes tetrafluoroethylene.

According to the water-resistant nanofilm described in one embodiment, the fluorocarbon gas includes hexafluoroethane.

According to the water-resistant nanofilm described in one embodiment, the fluorocarbon gas is one selected from carbon tetrafluoride, tetrafluoroethylene and hexafluoroethane.

According to the water-resistant nanofilm described in one embodiment, a static contact angle of the water-resistant nanofilm is selected from 110°~115°, 115°~120°, 120°~125°, 125°~130°, 130°~135°, 135°~140°, 140°~145°, and 145°~150°.

According to the water-resistant nanofilm described in one embodiment, the water-resistant nanofilm is formed of one, two or three of monomer 1, monomer 2 and monomer 3 as reaction materials for vapor deposition.

According to the water-resistant nanofilm described in one embodiment, the monomer 1 has a structural formula (I) $Y-C_mH_{2m}-C_nF_{2n+1}$, where m is an integer ranging from 0 to 4, n is an integer ranging from 1 to 12, and Y represents an organic functional group.

According to the water-resistant nanofilm described in one embodiment, m is an integer ranging from 0 to 2.

According to the water-resistant nanofilm described in one embodiment, n is an integer ranging from 1 to 7.

According to the water-resistant nanofilm described in one embodiment, Y is selected from a group consisting of: vinyl, halogened vinyl, alkyl substituted vinyl, acrylate group, C=C—O—C(O), methacrylate group, hydroxyl, halogen, and $(C_pH_{2p+1}O_q)3Si-$, wherein p is an integer ranging from 0 to 4 and q is an integer ranging from 0 to 2.

According to the water-resistant nanofilm described in one embodiment, p is 1 or 2 and q is 1.

According to the water-resistant nanofilm described in one embodiment, the monomer 1 includes 1H,1H,2H,2H-perfluorooctyl acrylate.

According to the water-resistant nanofilm described in one embodiment, the monomer 1 includes 1H,1H,2H,2H-perfluorohexyl acrylate.

According to the water-resistant nanofilm described in one embodiment, the monomer 1 includes perfluoro-2-methyl-2-pentene.

According to the water-resistant nanofilm described in one embodiment, the monomer 1 includes perfluorohexane.

According to the water-resistant nanofilm described in one embodiment, the monomer 1 includes 1H,1H,2H,2H-perfluorooctyltriethoxysilane.

According to the water-resistant nanofilm described in one embodiment, the monomer 2 has a structural formula (II)

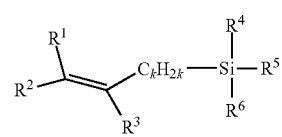

wherein $R_1$, $R_2$, $R_3$, $R_4$, $R_5$ and $R_6$ are respectively selected from hydrogen, alkyl, aryl, halogenated aryl, halogen, halogenated alkyl, alkoxy and vinyl, and k is an integer ranging from 0 to 4.

According to the water-resistant nanofilm described in one embodiment, k is an integer ranging from 0 to 2.

According to the water-resistant nanofilm described in one embodiment, the monomer 2 includes vinyl triethoxysilane.

According to the water-resistant nanofilm described in one embodiment, the monomer 2 includes vinyl trimethoxysilane.

According to the water-resistant nanofilm described in one embodiment, the monomer 3 has a structural formula (III)

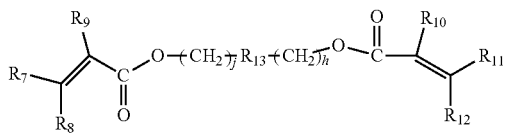

wherein $R_7$, $R_8$, $R_9$, $R_{10}$, $R_{11}$ and $R_{12}$ are respectively selected from hydrogen, alkyl, aryl, halogen, halogenated alkyl, and halogenated aryl, and j as well as h are integers ranging from 0 to 10 but not both be 0 in the meantime, and $R_{13}$ represents bond, —CO—, —COO—, arylene, alicyclic alkylene or hydroxylsubstituted aliphatic alkylene.

According to the water-resistant nanofilm described in one embodiment, the monomer 3 is a multifunctional compound containing ester group, ether group, epoxy group and/or cyano group.

According to the water-resistant nanofilm described in one embodiment, the monomer 3 comprises one or more selected from a group consisting of glycidyl methacrylate, allyl glycidyl ether, 1,2-epoxy-4-vinyl cyclohexane, 3-(2,3-epoxy-propoxy) propyl vinyl dimethoxysilane and enbucrilate.

According to the water-resistant nanofilm described in one embodiment, the monomer 3 includes 1,2-epoxy-4-vinyl cyclohexane.

According to the water-resistant nanofilm described in one embodiment, the substrate is one selected from a group consisting of: electronic products, silk fabric, woven bag, metal products, glass products and ceramic products.

According to the water-resistant nanofilm described in one embodiment, a thickness of the water-resistant nanofilm ranges from 10 to 2000 nm.

Another aspect of the present disclosure provides a preparation method for a water-resistant nanofilm, and the water-resistant nanofilm is formed of fluorocarbon gas as plasma source gas on a surface of a substrate by plasma enhanced chemical vapor deposition via a PECVD device.

According to the preparation method for the water-resistant nanofilm described in one embodiment, a discharge power of the PECVD device ranges from 30 to 200 W.

According to the preparation method for water-resistant nanofilm described in one embodiment, a pressure of a reaction chamber of the PECVD device ranges from 10 to 500 millitorr.

According to the preparation method for water-resistant nanofilm described in one embodiment, a temperature of a reaction chamber of the PECVD device ranges from 30° C.~60° C.

According to the preparation method for water-resistant nanofilm described in one embodiment, the preparation method includes cleaning the substrate.

According to the preparation method for water-resistant nanofilm described in one embodiment, the preparation method includes operating the substrate so that the substrate moves in a chamber of the PECVD device.

Another aspect of the present disclosure provides a water-resistant method for a surface of a substrate, the substrate is exposed to plasma source which contains a structural formula $C_xF_{2x+2}$ or $C_xF_{2x}$, and reaction materials are added to form the water-resistant nanofilm on the surface of the substrate by plasma enhanced chemical vapor deposition, and wherein x is 1, 2 or 3.

According to the water-resistant method for the surface of substrate described in one embodiment, the reaction materials are selected from one, two or three of monomer 1, monomer 2 and monomer 3.

According to the water-resistant method for the surface of substrate described in one embodiment, the substrate is one selected from: electronic products, silk fabric, woven bag, metal products, glass products and ceramic products.

Another aspect of the present disclosure provides an article comprising the water-resistant nanofilm, and the article is prepared by exposing the article to plasma source which contains a structural formula $C_xF_{2x+2}$ or $C_xF_{2x}$, and forming the water-resistant nanofilm on at least part of surfaces of the article from reaction materials by plasma enhanced chemical vapor deposition, and x is 1, 2 or 3.

According to the article comprising the water-resistant nanofilm described in one embodiment, the reaction materials are selected from one, two or three of monomer 1, monomer 2 and monomer 3.

According to the article comprising the water-resistant nanofilm described in one embodiment, the article is one selected from: electronic products, silk fabric, woven bag, metal products, glass products and ceramic products.

DETAILED DESCRIPTION

The following description is intended to expose the present disclosure to enable persons skilled in the field to implement the present disclosure. The preferred embodiments described below are only examples, and the persons skilled in the field can think of other obvious variations. The basic principles of the present disclosure defined in the following descriptions may be applied to other embodiments, variations, improvements, equivalents and other technical solutions that do not deviate from the spirit and scope of the present disclosure.

The present disclosure provides a water-resistant nanofilm and its preparation method and application. The water-resistant nanofilm or nanocoating comprises carbon, hydrogen and fluorine. Preferably, the water-resistant nanofilm comprises oxygen, carbon, hydrogen and fluorine. The water-resistant nanofilm has good hydrophobic performance. In other words, when the water-resistant nanofilm is attached to a surface of a substrate, it can make the surface of the substrate have better water resistance to avoid damage by water or other liquids.

In some embodiments, the substrate can be an electronic product, a silk fabric, a woven bag, a metal surface, a glass surface, a ceramic surface and so on. In other words, when the water-resistant nanofilm is attached to the surface of electronic products, silk goods, woven bags, metal products, glass products, ceramic products, they can have better water resistance to avoid damage by water or other liquids.

Further, when water is contact with the water-resistant nanofilm, a static contact angle of water is greater than 110°, for instance, the static contact angle greater than 120°, for instance, the static contact angle greater than 140°. For instance, the range of static contact angle is 110°~115°, 115°~120°, 120°~125°, 125°~130°, 130°~135°, 135°~140°, 140°~145°, or 145°~150°. Therefore, the water-resistant nanofilm has good anticorrosion. For instance, when the water-resistant nanofilm is deposited on the surface of the substrate after a long time of salt spray test, the surface of the substrate is not corroded or only has a small number of corrosion points, as shown in the subsequent embodiment.

The water-resistant nanofilm is a nanofilm with tiny thickness, the thickness range is for instance but not limited to 10-2000 nm.

According to the embodiment of the present disclosure, the water-resistant nanofilm is formed on the surface of the substrate by plasma enhanced chemical vapor deposition (PECVD) process. In other words, during the preparation process, the surface of the substrate is exposed to a plasma enhanced chemical vapor deposition reaction chamber in which plasma is formed and the water-resistant nanofilm is formed on the surface of the substrate by reaction material deposition reaction.

Plasma enhanced chemical vapor deposition (PECVD) has many advantages compared with other existing deposition processes. The first is that dry film formation does not require the use of organic solvents. The second is that the etching effect of plasma on the surface of the substrate makes the film deposited on the substrate bond well. The third is that film can be uniformly deposited on irregular substrate surface, and the gas phase permeability is very strong. The fourth is that the coating has good designability, and the chemical vapor method can control the coating thickness at the nanometer scale compared with the liquid method. The fifth is that the coating structure is easy to design, and chemical gas phase method uses plasma activation to initiate for the composite coating of different materials without designing specific initiator, and various raw materials can be compounded together through the control of input energy. The sixth is good compactness. CVD usually activates multiple active sites in the plasma initiation process, which is similar to a solution reaction in which there are multiple functional groups on a molecule, through which molecular chains form cross-linked structures. The seventh is that its universality is excellent as a means of coating technology, and the object of coating as well as the selection of raw materials used for coating are very wide.

The plasma enhanced chemical vapor deposition (PECVD) process generates plasma through glow discharge, and the discharge methods include microwave discharge, radio frequency discharge, ultraviolet discharge, electric spark discharge, etc.

Further, according to some embodiments of the present disclosure, the water-resistant nanofilm takes fluorocarbon gas as a plasma source gas during its formation. In other words, plasma is generated through fluorocarbon gas to provide plasma atmosphere reaction conditions for reaction materials.

It is worth to mention that inert gases such as helium or argon are used as the plasma source gas to supply the reaction polymerizable materials to the chamber in most existing PECVD process. Inert gas and radio frequency bias can be used to form plasma in the treatment chamber. It is found that when inert gas is used as plasma source and the carbon atom number of perfluorocarbon chain is lower than 6, especially lower than 4, the hydrophobicity of nanocoating obtained by plasma chemical vapor deposition is generally poor, and even the contact angle is lower than 100°. According to an embodiment of the present disclosure, the water-resistant nanofilm uses fluorocarbon gas as plasma source gas, and the reaction raw material gas contains perfluorocarbon chain. When the number of carbon atoms is low, it still has good hydrophobicity, such as a contact angle greater than 120°.

Further, the plasma source gas forming the water-resistant nanofilm has a structural formula: $C_xF_{2x+2}$ or $C_xF_{2x}$, where x is 1, 2 or 3. That is, the plasma source used has a maximum carbon atom number of 3 and less than 4. In other words, one of the raw materials of the water-resistant nanofilm has a low carbon atom number, thereby reducing the formation of environmentally harmful and refractory organic matter. Preferably, the plasma source gas is selected from one of the carbon tetrafluoride, tetrafluoroethylene and hexafluoroethane.

It is also worth to mention that the use of fluorocarbon gas as plasma source has many advantages. The first is that the plasma source itself has a high fluorine content, which increases the fluorine content in the nanocoating correspondingly, and the increase of fluorine content is conducive to improving the hydrophobic performance. The second is that nanocoating with water contact angle greater than 120° can be obtained even if the reaction materials with perfluorocarbon chain carbon atom number less than 6 or 6. The third is that the plasma formed of fluorocarbon plasma source has a stronger etching ability on the surface of the substrate, which is conducive to the formation of rough structure on the surface of the substrate, which can not only improve the hydrophobicity, but also improve the adhesion between the coating and the substrate.

Further, according to the embodiment of the present disclosure, the reaction raw materials of the water-resistant nanofilm can be selected from compounds with structural monomer 1 and monomer 2 in the formation process. Monomer 3 can also be added to improve the crosslinking degree of the nanocoating. Monomer 1, 2 and 3 respectively have the structure of formulas (I), (II) and (III):

Monomer 1:

$$Y-C_mH_{2m}-C_nF_{2n+1} \qquad (I)$$

Wherein m is an integer from 0 to 4, n is an integer from 1 to 12, and Y represents an organic functional group, and is selected from the following structure: vinyl, halogened vinyl, alkyl substituted vinyl, acrylate group, C=C—O—C(O), methacrylate group, hydroxyl; halogen, and $(C_pH_{2p+1}O_q)3Si$—, wherein p is an integer from 0 to 4 and q is an integer from 0 to 2.

As the buffer chain segment between functional group Y and perfluoroalkyl carbon chain, it should be controlled within an appropriate range of chain length. It will reduce the fluorine content of the whole molecule when the long chain length is too long, so as not conducive to improving the hydrophobic performance. Therefore, m is preferably selected from an integer of 0-2.

In order to avoid the burden of PFOA and PFOS on the environment, n is preferably selected from an integer from 1 to 7.

As a substituent of silane, p is preferably selected from 1 or 2, and q is preferably 1.

Monomer 2:

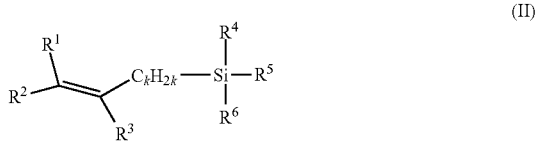

(II)

$R_1$, $R_2$, $R_3$, $R_4$, $R_5$, $R_6$ are respectively selected from hydrogen, alkyl, aryl, halogenated aryl, halogen, halogenated alkyl, alkoxy, vinyl, and k is an integer from 0 to 4.

As a buffer segment between unsaturated double bond and Si, k is preferably selected from 0-2.

In order to further improve the compactness of the nanocoating, monomer 3 with double functional group structure is added:

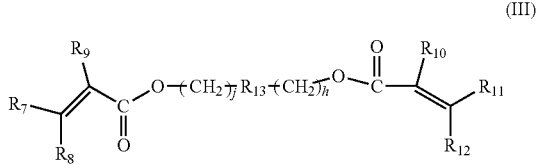

(III)

$R_7$, $R_8$, $R_9$, $R_{10}$, $R_{11}$, $R_{12}$ are respectively selected from hydrogen, alkyl, aryl, halogen, haloalkyl, haloaryl. J and h are integers ranging from 0 to 10 but not both be 0 in the meantime. $R_{13}$ is bond, —CO—, —COO—, arylene, alicyclic alkylene or hydroxyl substituted aliphatic alkylene. The monomer 3 is a multifunctional compound containing ester group, ether group, epoxy group and/or cyano group. Preferably, the monomer 3 comprises one or more selected from a group consisting of glycidyl methacrylate, allyl glycidyl ether, 1,2-epoxy-4-vinyl cyclohexane, 3-(2,3-epoxy-propoxy) propyl vinyl dimethoxysilane and enbucrilate.

Thus, according to the embodiment of the present disclosure, the plasma source generates the plasma, to provide the basic conditions of reaction, and to be as one of the raw materials. Meanwhile, the monomer 1, 2 and/or monomer 3 are added into the plasma atmosphere as post-reaction materials, and the carbon atomic number of monomer 1, 2, or 3 is relatively low, no matter whether it is the plasma source or the monomer 1, 2, or 3 as the reaction materials. In other words, the water-resistant nanofilm is formed of a compound with a low carbon atom number as a whole, so as to avoid polluting the environment from the perspective of raw materials. On the other hand, the plasma source gas has a high fluoride content, so the deposited product, namely, the water-resistant nanofilm, has a high fluoride content, thus compensating for the poor hydrophobicity caused by the reduction of carbon atom number.

Further, according to the embodiment of the present disclosure, the water-resistant nanofilm preparation process is that the hydrophobic nanocoating was prepared on the surface of the substrate by PECVD process. The substrate is placed in a vacuum or low-pressure reaction chamber, and reaction materials are introduced to generate plasma by glow discharge. The reaction materials are activated to produce chemical vapor deposition reaction on the surface of the substrate.

This kind of reaction raw material can be the chemical substance, which is gas under normal temperature and pressure. It can also be the steam formed by pressure reduction, heating and other ways of liquid substances with boiling point below 350° C. under normal pressure. In the deposition process, the present disclosure also introduces fluorocarbon that is gas state under atmospheric pressure as a plasma source to generate plasma and stabilize plasma concentration balance in the reaction system.

According to the embodiment of the present disclosure, the preparation method of the water-resistant nanofilm includes the following steps:

1) Substrate Preparation

The substrate should be cleaned before chemical vapor deposition. Dust, moisture and grease on the surface of the substrate will adversely affect the deposition effect. The substrate is cleaned with acetone or isopropyl alcohol and then dried in a drying oven.

2) Nanocoating Preparation by Chemical Vapor Deposition on the Substrate (1) The substrate with clean surface is placed in the plasma device or the reaction chamber of the equipment, and then the reaction chamber is vacuumed continuously, and the vacuum degree of the reaction chamber is pumped to 1~2000 millitorr.

(2) Open the motion mechanism to make the substrate in a movement state in the chamber. Plasma is generated through the plasma source gas in the chamber by radiofrequency discharge, microwave, ultraviolet irradiation and other means in the chamber. Monomer of the reaction raw material, such as monomer 1, monomer 2 and/or monomer 3, can be introduced together with the plasma source, or the substrate can be pretreated for 1-1200s after the plasma source is introduced, and then the reaction monomer can be introduced according to the requirements of the process parameters. In other words, during the preparation of the water-resistant nanofilm, the substrate is operated so that the substrate moves in the chamber of the PECVD device, that is, in a dynamic vapor deposition process. It is worth to mention that the water-resistant nanofilm formed on the surface of the substrate is more uniform and has stable performance by making the substrate rotate in the chamber.

(3) Set the pressure and temperature of the vacuum reaction chamber, and different monomers are introduced together. Adjust a plasma generation power at 1-500 W and a chamber temperature at 10-100° C. for plasma chemical vapor deposition. After the reaction is completed, stop the introduction of the monomer and increase the chamber pressure to atmospheric pressure.

Preferably, the plasma source gases are selected from carbon tetrafluoride, tetrafluoroethylene and hexafluoroethane.

Reaction raw materials, like monomer 1 and monomer 2 are mixed together to be introduced or introduced separately, or any of them can be chosen to be introduced. Monomer 3 can be chosen to enter or not enter. Alternatively, monomer 3 can be introduced firstly to deposit the first layer, and then monomer 1 or monomer 2 can be introduced. When monomer 3 and either monomer 1 or monomer 2 are introduced together, the proportion of monomer 3 is not higher than 30%.

The treated substrate can be electronic products, silk fabrics, woven bags, metal surface, glass surface, ceramic surface, and so on.

Further, preferably, the operating power range of the plasma device is 30-200 W, the pressure range is 10~500 millitorr, and the temperature range is 30° C.~60° C.

The water-resistant nanofilm can be used to improve the water resistance or liquid resistance performance of the surface of the substrate, that is, to make the surface of the substrate have water resistance or liquid resistance. For instance, the method for making the substrate surface water-resistant can include that the substrate is exposed to a plasma source atmosphere containing $C_xF_{2x+2}$ or $C_xF_{2x+2}$, and the reaction material is added for plasma-enhanced chemical vapor deposition to form waterproof nanofilm on the substrate surface, wherein x is 1, 2 and 3.

The water-resistant nanofilm can be formed on the surface of an article, thereby improving the water resistance or liquid resistance of the surface or at least part of the surface of the article after processing. For instance, an article with a water-resistant nanofilm is prepared by exposing the article to a plasma source atmosphere containing a structure formula: plasma-enhanced chemical vapor deposition of the reaction material to form the water-resistant nanofilm on at least part of the surface of the article in atmosphere of plasma of $C_xF_{2x+2}$ or $C_xF_{2x}$, wherein x is 1, 2, and 3. The article is one selected from: electronic products, silk fabrics, woven bags, metal products, glass products, ceramic products.

Example 1

Taking PCB board as substrate material, the water-resistant nanocoating was formed on the surface of PCB board through PECVD device, with carbon tetrafluoride as plasma source gas and the monomer 1 (1H,1H,2H,2H-perfluorooctyl acrylate) as reaction raw material. The specific steps included as follows: (1) The PCB board was placed in a plasma vacuum reaction chamber of 200 L, and the reaction chamber was vacuumed continuously to make the vacuum degree reach 20 millitorr. (2) Carbon tetrafluoride was introduced with a flow rate of 40 sccm, and radio frequency discharge was started for plasma discharge with a discharge power of 100 W and continuous discharge of 100s. (3) 1H,1H,2H,2H-perfluorooctyl acrylate (monomer 1) was vaporized and introduced into the reaction chamber, and chemical vapor deposition was carried out on the substrate surface to prepare the nanocoating. In the process of coating preparation, steam of the monomer 1 flowed at a rate of 120 µL/min for 2000s, and pulse width was 200 µs. (4) After the coating preparation, nitrogen was introduced into the reaction chamber to restore to normal pressure. Then the chamber was opened and the PCB board was taken out.

Example 2

Taking PCB board as substrate material, the water-resistant nanocoating was formed on the surface of PCB board through PECVD device, with carbon tetrafluoride as plasma source gas and monomer 1 (1H,1H,2H, 2H-perfluorohexyl acrylate) as reaction raw material. The specific steps included as follows: (1) The PCB board was placed in a plasma vacuum reaction chamber of 200 L, and the vacuum of the reaction chamber was continuously vacuumed to reach 30 millitorr. (2) Carbon tetrafluoride was introduced with a flow rate of 40 sccm, and radio frequency discharge was started for plasma discharge with a discharge power of 120 W and continuous discharge of 100s. (3) 1H,1H,2H, 2H-perfluorohexyl acrylate (monomer 1) was vaporized and introduced into the reaction chamber, and chemical vapor deposition was carried out on the surface of the substrate to prepare the nanocoating. In the process of coating preparation, steam of the monomer 1 flowed at a rate of 150 µL/min for 2500s, and pulse width was 100 µs. (4) After the coating preparation, nitrogen was introduced into the reaction chamber to restore to normal pressure. Then the chamber was opened and the PCB board was taken out.

Example 3

Taking nylon woven watch strap as substrate material, the water-resistant nanocoating was formed on the surface of the nylon woven watch strap by PECVD device. Tetrafluoroethylene was used as plasma source gas and monomer 1 (perfluoro-2-methyl-2-pentene) was used as reaction material. The specific steps included as follows: (1) The Nylon woven watch strap was placed in a plasma vacuum reaction chamber of 500 L. Continuously vacuum the reaction chamber to achieve 80 millitorr. (2) Tetrafluoroethylene was introduced with a flow rate of 30 sccm. Radio frequency discharge was started for plasma discharge with a discharge power of 50 W and continuous discharge of 300s. (3) Perfluoro-2-methyl-2-pentene (monomer 1) was vaporized and introduced into the reaction chamber, and the nanocoating was prepared by chemical vapor deposition on the substrate surface. In the process of coating preparation, steam of the monomer 1 flowed at a rate of 150 µL/min for 3500s, and pulse width of discharge was 2000 µs. (4) After the preparation of the coating, nitrogen was introduced into the reaction chamber to restore to normal pressure. Then the chamber was opened and the watch strap was taken out.

Example 4

Taking speaker cloth as substrate material, the water-resistant nanocoating was formed on the surface of the speaker cloth by PECVD device, with tetrafluoroethylene as plasma source gas and monomer 1 (perfluorohexane) as the reaction raw material. The specific steps included as follows: (1) The speaker cloth was placed in a plasma vacuum reaction chamber of 1000 L, and the vacuum of the reaction chamber was continuously vacuumed to reach 100 millitorr. (2) Tetrafluoroethylene was introduced with a flow rate of 30 sccm. Radio frequency discharge was started for plasma discharge with a discharge power of 50 W and continuous discharge of 300s. (3) Perfluorohexane (monomer 1) was vaporized and introduced into the reaction chamber, and the nanocoating was prepared by chemical vapor deposition on the substrate surface. In the process of coating preparation, the monomer 1 flowed at a rate of 250 µL/min for 3500s, and pulse width was 1000 µs. (4) After the preparation of the coating, nitrogen was introduced into the reaction chamber to restore to normal pressure. Then the chamber was opened and the speaker cloth was taken out.

Example 5

Taking iron sheet as substrate material, the water-resistant nanocoating was formed on the surface of the iron sheet by PECVD device, with hexafluoroethane as plasma source gas and monomer 1 (perfluorohexane) as the reaction raw material. The specific steps included as follows: (1) The iron sheet was placed in a vacuum reaction chamber of 1000 L, and the vacuum of the reaction chamber was continuously vacuumed to reach 80 millitorr. (2) Hexafluoroethane was introduced with a flow rate of 100 sccm. Radio frequency discharge was started for plasma discharge with a discharge power of 50 W and continuous discharge of 600s. (3) Perfluorohexane (monomer 1) was vaporized and introduced into the reaction chamber, and the nanocoating is prepared by chemical vapor deposition on the substrate surface. In the process of coating preparation, the monomer 1 flowed at a rate of 250 μL/min for 3500s, and pulse width was 1000 μs. (4) After the preparation of the coating, nitrogen was introduced into the reaction chamber to restore to normal pressure. Then the chamber was opened and the iron sheet was taken out.

Example 6

Taking copper sheet as substrate material, the water-resistant nanocoating was formed on the surface of the copper sheet by PECVD device, with hexafluoroethane as plasma source gas and monomer 1 (perfluorohexane) as the reaction raw material. The specific steps included as follows: (1) The copper sheet was placed in a vacuum reaction chamber of 2000 L, and the vacuum of the reaction chamber was continuously vacuumed to reach 100 millitorr. (2) Hexafluoroethane was introduced with a flow rate of 100 sccm. Microwave was started for plasma discharge with a discharge power of 500 W and continuous discharge of 600s. (3) Perfluorohexane (monomer 1) was vaporized and introduced into the reaction chamber, and the nanocoating was prepared by chemical vapor deposition on the substrate surface. In the process of coating preparation, the monomer 1 flowed at a rate of 350 μL/min for 3500s, and the microwave discharge was intermittent, and the discharge was turned off for 5 ms every 100 μs. (4) After the preparation of the coating, nitrogen was introduced into the reaction chamber to restore to normal pressure. Then the chamber was opened and the copper sheet was taken out.

Example 7

Taking PCB board as substrate material, the water-resistant nanocoating was formed on the surface of PCB board through PECVD device, with carbon tetrafluoride as plasma source gas and monomer 2 (vinyl triethoxysilane) as reaction raw material. The specific steps included as follows: (1) The PCB board was placed in a plasma vacuum reaction chamber of 10 cubic meters, and the vacuum of the reaction chamber was continuously vacuumed to reach 200 millitorr. (2) Carbon tetrafluoride was introduced with a flow rate of 40 sccm, and radio frequency discharge was started for plasma discharge with a discharge power of 100 W and continuous discharge of 100s. (3) Vinyl triethoxysilane (monomer 2) was vaporized and introduced into the reaction chamber, and the nanocoating was prepared by chemical vapor deposition on the substrate surface. In the process of coating preparation, the monomer 2 flowed at a rate of 220 μL/min for 3000s, and pulse width of discharge was 200 μs. (4) After the preparation of the coating, nitrogen was introduced into the reaction chamber to restore to normal pressure. Then the chamber was opened and the PCB board was taken out.

Example 8

Taking PCB board as substrate material, the water-resistant nanocoating was formed on the surface of PCB board through PECVD device, with tetrafluoroethylene as plasma source gas and monomer 1 (1H,1H,2H,2H-Perfluorooctyl-triethoxysilane) and monomer 2 (vinyl trimethoxysilane) as reaction raw material. The specific steps included as follows: (1) The PCB board was placed in a plasma vacuum reaction chamber of 10 cubic meters, and the vacuum of the reaction chamber was continuously vacuumed to reach 100 millitorr. (2) Tetrafluoroethylene was introduced with a flow rate of 40 sccm, and radiofrequency discharge was started for plasma discharge with a discharge power of 200 W and continuous discharge of 100s. (3)1H,1H,2H,2H-Perfluorooctyltriethoxysilane(monomer 1) and vinyl trimethoxysilane (monomer 2) are vaporized and introduced into the reaction chamber, and the nanocoating was prepared by chemical vapor deposition on the substrate surface. In the process of coating preparation, the monomer 1 and monomer 2 respectively flowed at a rate of 150 μL/min, 120 μL/min for 3000s, and pulse width of discharge was 800 μs. (4) After the preparation of the coating, nitrogen was introduced into the reaction chamber to restore to normal pressure. Then the chamber was opened and the PCB board was taken out.

Example 9

Taking PCB board as substrate material, the water-resistant nanocoating was formed on the surface of PCB board through PECVD device, with tetrafluoron as plasma source gas, monomer 3 (1,2-epoxy-4-vinyl cyclohexane), monomer 1 (1H,1H,2H,2H-perfluorooctyltriethoxysilane) and monomer 2 (vinyl trimethoxysilane) as reaction raw material. The specific steps included as follows: (1) The PCB board was placed in a plasma vacuum reaction chamber of 10 cubic meters, and the vacuum of the reaction chamber was continuously vacuumed to reach 1 torr. (2) Tetrafluoron was introduced with a flow rate of 40 sccm, and radiofrequency discharge was started for plasma discharge with a discharge power of 300 W and continuous discharge of 100s. (3) 1,2-epoxy-4-vinyl cyclohexane (monomer 3) was firstly introduced into the reaction chamber with a flow rate of 320 μL/min for 2000s. Then, 1H,1H,2H,2H-perfluorooctyltriethoxysilane(monomer 1) and vinyl triethoxysilane (monomer 2) were vaporized and introduced into the reaction chamber, and the nanocoating was prepared by chemical vapor deposition on the substrate surface. In the process of coating preparation, the monomer 1 and monomer 2 respectively flowed at a rate of 150 μL/min, 120 μL/min for 3000s, and pulse width of discharge was 200 μs. (4) After the preparation of the coating, nitrogen was introduced into the reaction chamber to restore to normal pressure. Then the chamber was opened and the PCB board was taken out.

Example 10

Taking PCB board as substrate material, the water-resistant nanocoating was formed on the surface of PCB board through PECVD device, with tetrafluoroethylene as plasma source gas, monomer 1 (1H,1H,2H,2H-perfluorooctyltriethoxysilane), monomer 2 (vinyl trimethoxysilane) and monomer 3 (1,2-epoxy-4-vinyl cyclohexane) as reaction raw material. The specific steps included as follows: (1) The PCB board was placed in a plasma vacuum reaction chamber of 10 cubic meters, and the vacuum of the reaction chamber was continuously vacuumed to reach 1 torr. (2) Tetrafluoroethylene was introduced with a flow rate of 40 sccm, and radiofrequency discharge was started for plasma discharge with a discharge power of 300 W and continuous discharge of 100s. (3)1H,1H,2H,2H-perfluorooctyltriethoxysilane(monomer 1), vinyl trimethoxysilane (monomer 2) and 1,2-epoxy-4-vinyl cyclohexane (monomer 3) were vaporized and introduced into the reaction chamber together, and the nanocoating was prepared by chemical vapor deposition on the substrate surface. In the process of coating preparation, the monomer 1 monomer 2 and monomer 3 respectively flowed at a rate of 20 μL/min, 150 μL/min, 120

μL/min for 3000s, and pulse width of discharge was 200 μs. (4) After the preparation of the coating, nitrogen was introduced into the reaction chamber to restore to normal pressure. Then the chamber was opened and the PCB board was taken out.

Comparable Example 1

Taking PCB board as substrate material, and the water-resistant nanocoating was formed on the surface of PCB board through PECVD device, with inert helium gas as plasma source gas and monomer 1 (1H,1H,2H,2H-perfluorooctyl acrylate) as reaction raw material. The specific steps included as follows: (1) the PCB board was placed in a plasma vacuum reaction chamber of 200 L, and the reaction chamber was vacuumed continuously to make the vacuum degree reach 20 millitorr. (2) Helium gas was introduced with a flow rate of 40 sccm, and radio frequency discharge was started for plasma discharge with a discharge power of 100 W and continuous discharge of 100s. (3) 1H,1H,2H,2H-perfluorooctyl acrylate (monomer 1) was vaporized and introduced into the reaction chamber, and chemical vapor deposition was carried out on the substrate surface to prepare the nanocoating. The monomer 1 flowed at a rate of 120 μL/min for 2000s, and pulse width was 200 μs. (4) After the coating preparation, nitrogen was introduce into the reaction chamber to restore to normal pressure. Then the chamber was opened and the PCB board was taken out.

Hydrophobic performance test, surface adhesion test and salt spray resistance test are respectively carried out for the aforesaid embodiments. The specific test methods are as follows:

The thickness of nanocoating is measured by American FilmetricsF20-UV-film thickness measuring instrument.

Nanocoating water contact angle is measured according to GB/T 30447-2013 standard test.

Adhesion test method is according to GB/T 9286-1998 standard for cross-cut test.

Salt spray resistance test is according to GB/T 2423.18-2000 environmental test method for electrical and electronic products.

The test results are as follows:

| Example | Thickness/nm | Contact angel/° | Adhesion test (cross-cut test) level | Salt spray resistance test (h) |
|---|---|---|---|---|
| Example1 | 156 | 119 | 0 | 34 |
| Example2 | 179 | 122 | 0 | 43 |
| Example3 | 242 | 136 | — | — |
| Example4 | 274 | 144 | — | — |
| Example5 | 292 | 126 | 0 | 10 |
| Example6 | 203 | 122 | 0 | 34 |
| Example7 | 192 | 128 | 0 | 59 |
| Example8 | 267 | 125 | 0 | 79 |
| Example9 | 479 | 128 | 0 | 91 |
| Example10 | 298 | 118 | 0 | 85 |
| Comparable Example1 | 174 | 108 | 1 | 30 |

Note:
Example3 and 4 are plastic polymers, which will not be tested by cross-cut test and salt spray resistance.

According to the data in the aforesaid table, this application method can be used as plasma source to obtain high hydrophobic nanocoating at the carbon atom number of perfluorocarbon chain less than 6. The salt spray resistance of coating can be improved by adding crosslinking agent.

The persons skilled in the field should understand that the embodiments of the present disclosure shown in the above description and attached drawings are only examples and do not limit the present disclosure. The purpose of the present disclosure is fully and effectively realized. The functional and structural principles of the present disclosure have been demonstrated and illustrated in embodiment, while the implementation of the embodiment may be subject to any distortion or modification without deviation from the principles described.

What is claimed is:

1. A water-resistant nanofilm, wherein the water-resistant nanofilm is formed on a surface of a substrate by plasma enhanced chemical vapor deposition through using fluorocarbon gas as plasma source,
wherein the fluorocarbon gas has a structural formula selected from $C_xF_{2x+2}$ and $C_xF_{2x}$, and x is 1, 2 or 3,
wherein the water-resistant nanofilm is formed of one, two or three selected from a group consisting of monomer 1, monomer 2 and monomer 3 as reaction materials for vapor deposition,
wherein the monomer 1 has a structural formula (I):

where m is an integer ranging from 0 to 4, n is an integer ranging from 1 to 12, and Y represents an organic functional group and is selected from the following structure: vinyl, halogened vinyl, alkyl substituted vinyl, acrylate group, C=C—O—C(O), methacrylate group, and, hydroxyl,
and the monomer 2 has a structural formula (II)

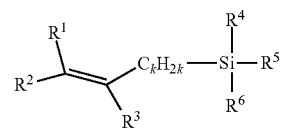

where $R_1$, $R_2$, $R_3$, $R_4$, $R_5$ and $R_6$ are respectively selected from hydrogen, alkyl, aryl, halogenated aryl, halogen, halogenated alkyl, alkoxy and vinyl, and k is an integer ranging from 0 to 4,
and the monomer 3 comprises one or more selected from a group consisting of glycidyl methacrylate, allyl glycidyl ether, 1,2-epoxy-4-vinyl cyclohexane, 3-(2,3-epoxy-propoxy) propyl vinyl dimethoxysilane and enbucrilate, or the monomer 3 has a structural formula (III),

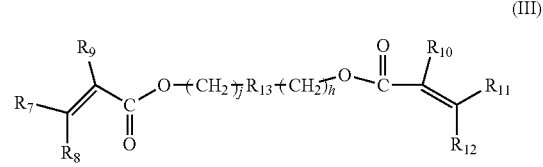

where $R_7$, $R_8$, $R_9$, $R_{10}$, $R_{11}$ and $R_{12}$ are respectively selected from hydrogen, alkyl, aryl, halogen, halogenated alkyl, and halogenated aryl, and i as well as h are integers ranging from 0 to 10 but not both be 0 in the meantime, and $R_{13}$ represents bond, —CO—, —COO—, arylene, alicyclic alkylene or hydroxyl substituted aliphatic alkylene,
wherein a thickness of the water-resistant nanofilm ranges from 10 to 2000 nm.

2. The water-resistant nanofilm according to claim 1, wherein the fluorocarbon gas is selected from a group consisting of: carbon tetrafluoride, tetrafluoroethylene and hexafluoroethane.

3. The water-resistant nanofilm according to claim 1, wherein a static contact angle of water of the water-resistant nanofilm is selected from 110°~115°, 115°~120°, 120°~125°, 125°~130°, 130°~135°, 135°~140°, 140°~145°, and 145°~150°.

4. The water-resistant nanofilm according to claim 1, wherein m is an integer ranging from 0 to 2, n is an integer ranging from 1 to 7.

5. The water-resistant nanofilm according to claim 1, wherein p is 1 or 2 and q is 1.

6. The water-resistant nanofilm according to claim 1, wherein the monomer 1 is selected from a group consisting of: 1H,1H,2H,2H-Perfluorooctylacrylate, 1H,1H,2H,2H-perfluorohexylacrylate, perfluoro-2-methyl-2-pentene, and 1H,1H,2H,2H-Perfluorooctyltriethoxysilane.

7. The water-resistant nanofilm according to claim 1, wherein k is an integer ranging from 0 to 2.

8. The water-resistant nanofilm according to claim 1, wherein the monomer 2 is selected from a group consisting of: vinyl triethoxysilane and vinyl trimethoxysilane.

9. The water-resistant nanofilm according to claim 1, wherein the substrate is one selected from a group consisting of: electronic products, silk fabric, woven bag, metal products, glass products and ceramic products.

10. An article comprising a water-resistant nanofilm, wherein the article is prepared by exposing the article to plasma source which contains a structural formula $C_xF_{2x+2}$ or $C_xF_{2x}$, and forming the water-resistant nanofilm on at least a part of surfaces of the article from reaction materials by plasma enhanced chemical vapor deposition, wherein x is 1, 2 or 3, wherein the water-resistant nanofilm is formed of one, two or three selected from a group consisting of monomer 1, monomer 2 and monomer 3 as reaction materials for vapor deposition, wherein the monomer 1 has a structural formula (I):

where m is an integer ranging from 0 to 4, n is an integer ranging from 1 to 12, and Y represents an organic functional group and is selected from the following structure: vinyl, halogened vinyl, alkyl substituted vinyl, acrylate group, C—C—O—C(O), methacrylate group, and, hydroxyl, and the monomer 2 has a structural formula (II)

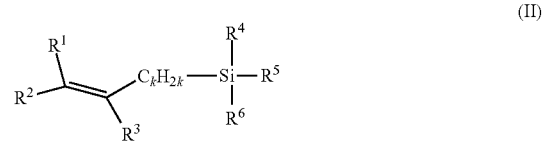

where $R_1$, $R_2$, $R_3$, $R_4$, $R_5$ and $R_6$ are respectively selected from hydrogen, alkyl, aryl, halogenated aryl, halogen, halogenated alkyl, alkoxy and vinyl, and k is an integer ranging from 0 to 4, and the monomer 3 comprises one or more selected from a group consisting of glycidyl methacrylate, allyl glycidyl ether, 1,2-epoxy-4-vinyl cyclohexane, 3-(2,3-epoxy-propoxy) propyl vinyl dimethoxysilane and enbucrilate, or the monomer 3 has a structural formula (III),

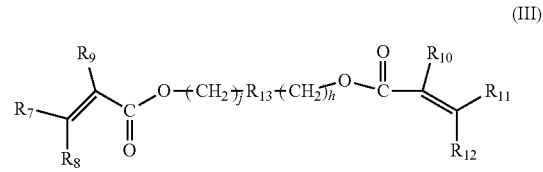

where $R_7$, $R_8$, $R_9$, $R_{10}$, $R_{11}$ and $R_{12}$ are respectively selected from hydrogen, alkyl, aryl, halogen, halogenated alkyl, and halogenated aryl, and i as well as h are integers ranging from 0 to 10 but not both be 0 in the meantime, and $R_{13}$ represents bond, —CO—, —COO—, arylene, alicyclic alkylene or hydroxyl substituted aliphatic alkylene, wherein a thickness of the water-resistant nanofilm ranges from 10 to 2000 nm.

* * * * *

UNITED STATES PATENT AND TRADEMARK OFFICE
CERTIFICATE OF CORRECTION

PATENT NO. : 12,173,175 B2  
APPLICATION NO. : 17/596949  
DATED : December 24, 2024  
INVENTOR(S) : Jian Zong Page 1 of 1

It is certified that error appears in the above-identified patent and that said Letters Patent is hereby corrected as shown below:

In the Claims

Claim 1, Column 16, Line 62, delete "and i as well" and insert --and j as well-- therefor.

Claim 10, Column 18, Line 3, delete "C-C-O-C(O)" and insert --C=C-O-C(O)-- therefor.

Claim 10, Column 18, Line 37, delete "and i as well" and insert --and j as well-- therefor.

Signed and Sealed this  
Eighteenth Day of February, 2025

Coke Morgan Stewart  
*Acting Director of the United States Patent and Trademark Office*